US011380674B2

(12) United States Patent
Chen et al.

(10) Patent No.: US 11,380,674 B2
(45) Date of Patent: Jul. 5, 2022

(54) ARRAY SUBSTRATE, DISPLAY PANEL AND DISPLAY DEVICE

(71) Applicant: Xiamen Tianma Micro-Electronics Co., Ltd., Xiamen (CN)

(72) Inventors: Jianrong Chen, Xiamen (CN); Manyu Lin, Xiamen (CN); Xiu Liang, Xiamen (CN); Xiaoli Xue, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 252 days.

(21) Appl. No.: 16/916,326

(22) Filed: Jun. 30, 2020

(65) Prior Publication Data

US 2021/0305236 A1     Sep. 30, 2021

(30) Foreign Application Priority Data

Mar. 30, 2020  (CN) .......................... 202010237445.7

(51) Int. Cl.
  *H01L 23/48*   (2006.01)
  *H01L 27/02*   (2006.01)
  *H01L 27/12*   (2006.01)

(52) U.S. Cl.
  CPC ........ *H01L 27/0292* (2013.01); *H01L 27/124* (2013.01)

(58) Field of Classification Search
  CPC .......................... H01L 27/0292; H01L 27/124

USPC ........................................................ 257/773
See application file for complete search history.

(56) References Cited

FOREIGN PATENT DOCUMENTS

| CN | 201007770 Y | 1/2008 |
| CN | 107065339 A | 8/2017 |
| CN | 207517281 U | 6/2018 |
| CN | 110429078 A | 11/2019 |
| JP | 4507480 | * 5/2010 |

* cited by examiner

*Primary Examiner* — Tan N Tran
(74) *Attorney, Agent, or Firm* — von Briesen & Roper, s.c.

(57) ABSTRACT

Disclosed are an array substrate, display panel and display device. The array substrate includes: a substrate, where the substrate includes a display area and a peripheral circuit area surrounding the display area; the peripheral circuit area is provided with a gate drive circuit; the gate drive circuit includes a group of shift registers connected in cascade; a first metal layer; a second metal layer; scan lines and connection structures corresponding to the scan lines one-to-one; where the first metal layer includes the scan lines; the second metal layer includes the connection structures; the shift registers include scan signal output ends; the scan signal output ends are electrically connected to the scan lines one-to-one through the connection structures; at least one end of at least one scan line is provided with an electrostatic dispersion structure; the electrostatic dispersion structure includes an electrostatic dispersion line or an first electrostatic dispersion ring.

18 Claims, 12 Drawing Sheets

ARRAY SUBSTRATE, DISPLAY PANEL AND DISPLAY DEVICE

CROSS-REFERENCE TO RELATED APPLICATIONS

This application claims priority to Chinese patent application No. CN 202010237445.7 filed with CNIPA on Mar. 30, 2020, the disclosure of which is incorporated herein by reference in its entirety.

TECHNICAL FIELD

The present disclosure relates to the field of display technologies, and particularly to an array substrate, a display panel and a display device.

BACKGROUND

With continuous development of science and technology, more and more electronic equipment with display functions are widely used in people's daily life and work, bringing great convenience to people's daily life and work, and becoming an indispensable and important tool for people today.

For a display panel, which is an important component for the electronic device to realize the display function, an array substrate is an important part. However, in a manufacturing process of the array substrate, the substrate will have static electricity caused by the friction between the back face of the substrate and the transfer mechanism during the transfer process. The static electricity causes induction electrification to a line on the front face of the substrate. Electrostatic discharge damage occurs when an electric field generated by the induction electrification on the line exceeds the dielectric strength of an insulating medium.

SUMMARY

In view of this, the present disclosure provides an array substrate, a display panel, and a display device.

In a first aspect, an embodiment of the present disclosure provides an array substrate, where the array substrate includes: a display area and a peripheral circuit area surrounding the display area, where the peripheral circuit area is provided with a gate drive circuit and the gate drive circuit includes at least one group of shift registers connected in cascade; a first metal layer, which is located on a side of the substrate; a second metal layer, which is located on a side of the first metal layer facing away from the substrate; and multiple scan lines and multiple connection structures corresponding to the multiple scan lines one-to-one.

The first metal layer includes the multiple scan lines; and the second metal layer includes the multiple connection structures.

The shift registers include multiple scan signal output ends; the multiple scan signal output ends are electrically connected to the multiple scan lines one-to-one through the multiple connection structures.

At least one end of at least one scan line of the multiple scan lines is provided with an electrostatic dispersion structure.

The electrostatic dispersion structure includes at least one electrostatic dispersion line or at least one first electrostatic dispersion ring.

In a second aspect, an embodiment of the present disclosure further provides a display panel, and the display panel includes the array substrate of the first aspect.

In a third aspect, an embodiment of the present disclosure further provides a display device. The display device includes the display panel of the second aspect.

BRIEF DESCRIPTION OF DRAWINGS

Other features, objectives and advantages of the present disclosure will become more apparent by reading the detailed description of the non-limiting embodiments with reference to the following drawings.

DETAILED DESCRIPTION

Figure 1:
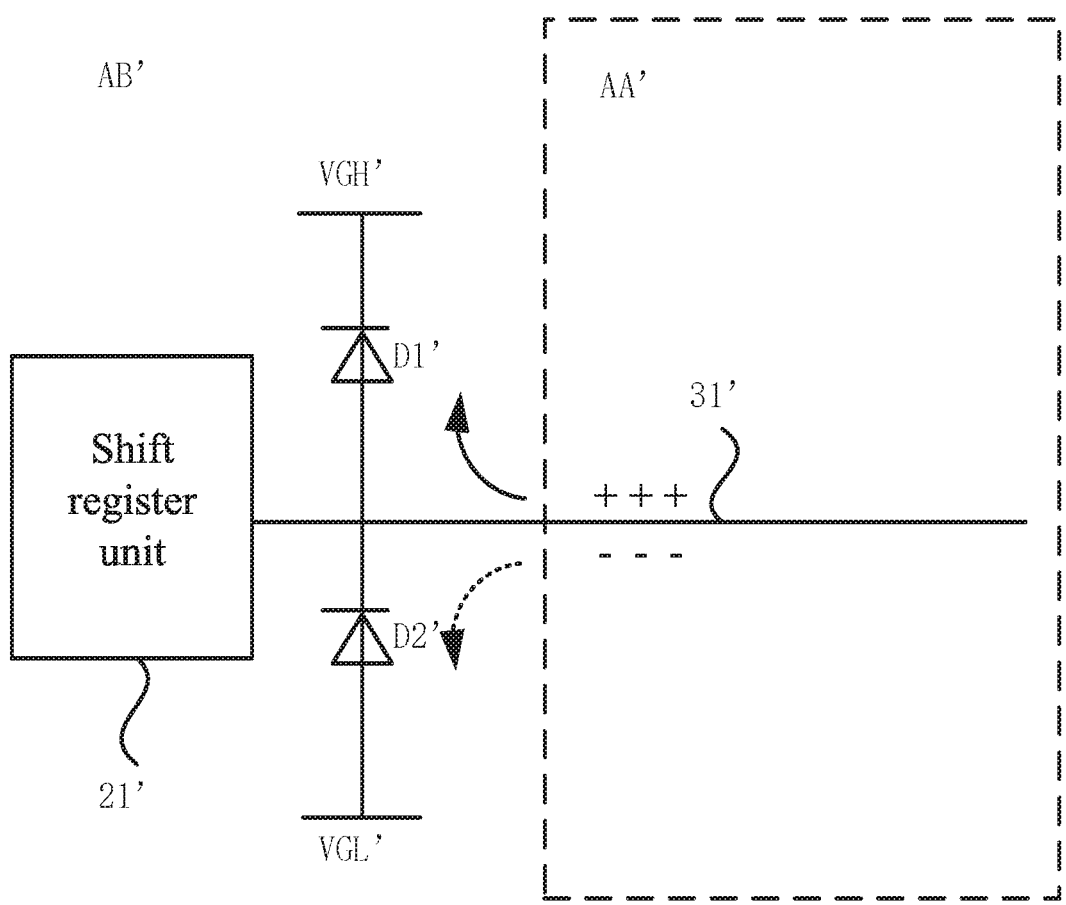
FIG. 1 is a structure diagram illustrating a top view of a portion of an array substrate in the related art.

In a manufacturing process of an array substrate, a substrate, such as a glass substrate, will have static electricity caused by the friction between the back face of the substrate and a transfer mechanism during the transfer process. The static electricity causes induction electrification to a line on the front face of the glass substrate. Electrostatic discharge damage occurs when an electric field generated by the induction electrification on the line exceeds the dielectric strength of an insulating medium. FIG. 1 is a structure diagram of a portion of an array substrate provided in the related art. As shown in FIG. 1, the array substrate in the related art includes a display area AA' and a peripheral circuit area AB' surrounding the display area AA'. The display area AA' is provided with a pixel circuit, and the peripheral circuit area AB' is provided with a gate drive circuit. The gate drive circuit includes one group of cascaded shift registers and multiple signal lines. The shift register includes multiple shift register units 21', and the signal lines may include a first power supply VGH' and a second power supply VGL'. In the related art, a first electrostatic discharge diode D1' is disposed between an end of a scan line 31' and the first power source VGH', and a second electrostatic discharge diode D2' is disposed between the end of the scan line 31' and the second power source VGL', so that static electricity generated during the manufacturing process of the array substrate is discharged through the electrostatic discharge diodes. Specifically, when the induced charges of the static electricity on the scan line 31' is positive and the generated voltage exceeds the first power supply VGH', the first electrostatic discharge diode D1 is turned on to discharge a part of the positive charges exceeding the voltage range of the first power supply VGH' to the second power supply VGL', as shown by the direction of the solid arrow in FIG. 1; when the induced charges of the static electricity on the scan line 31' is negative and the generated voltage is lower than the second power supply VGL', the second electrostatic discharge diode D2 is turned on and discharges a part of the negative charge exceeding the voltage range of the first power supply VGH' to the second power supply VGL', as shown by the direction of the dotted arrow in FIG. 1. However, the first power supply VGH' and the second power supply VGL' are located on a side of the scan line 31' facing away from the substrate. In this way, in manufacturing processes after the formation of the scan lines 31' and before the formation of the first power sources VGH' and the second power sources VGL', the array substrate as a semi-finished product of the processes does not have an anti-electrostatic function. That is, each scan lines 31' is an isolated conductor, and the electrostatic charges induced in the scan lines 31' cannot be discharged in the processes after the formation of the scan lines 31' and before the formation of the first power sources VGH' and the second power sources VGL'. Thus, when a strong electric field generated by the charges collected at the end of the scan line 31' exceeds the dielectric strength of the insulating medium, on one hand, the strong electric field may discharge to a structure arranged on a same layer in the gate drive circuit and damage the electronic elements in the gate drive circuit; on the other hand, the potential at each point along the line in the scan line 31' changes transiently at the breakdown moment of the insulating medium, a transient potential difference occurs between an active layer (not shown) in the pixel circuit in the display area AA' and the scan line 31', and when the potential difference exceeds the antistatic capability of the insulating layer between the active layer and the scan line 31', the insulating layer will be broken down, and a poor leakage current of the scan line 31' is generated.

Based on the above, the present disclosure provides an array substrate, a display panel, and a display device. The array substrate includes: a substrate, where the substrate includes a display area and a peripheral circuit area surrounding the display area, where the peripheral circuit area is provided with a gate drive circuit and the gate drive circuit includes at least one group of cascaded shift registers; a first metal layer, which is located on a side of the substrate; a second metal layer, which is located on a side of the first metal layer facing away from the substrate; multiple scan lines and multiple connection structures corresponding to the scan lines in one-to-one correspondence; where the first metal layer includes the scan lines; the second metal layer includes the connection structures; the shift registers include multiple scan signal output ends; the scan signal output ends are electrically connected with the scan lines one-to-one through the connection structures; at least one end of at least one scan line is provided with an electrostatic dispersion structure; and the electrostatic dispersion structure includes at least one electrostatic dispersion line or at least one first electrostatic dispersion ring. In the array substrate, the display panel and the display device provided by the present disclosure, at least one end of the scan line, that is, a place where electrostatic charges are easily gathered, is provided with an electrostatic dispersion structure, where the electrostatic dispersion structure includes at least one electrostatic dispersion line or at least one first electrostatic dispersion ring. Through the electrostatic dispersion line or the first electrostatic dispersion ring, the electrostatic distribution area at the end of the scan line is increased, and the charge density of the electrostatic charge in the accumulation area at the end of the scan line is reduced. Thereby the risk of breakdown of the insulating medium at the end of the scan line is reduced, and the anti-electrostatic damage ability of the display panel in the manufacturing process is improved. In addition, the scan line is electrically connected to the shift register in the gate drive circuit through the connection structure located in the second metal layer, that is, the static electricity at the end of the scan line is further discharged through the second metal layer. The damage to electronic elements in the shift register due to the fact that static charges induced on the scan line are transferred to the shift register when the scan line is directly and electrically connected with the shift register is alleviated or avoided, and the anti-electrostatic damage ability of the display panel in the production process is further improved.

The above is the core idea of the present disclosure. The present disclosure will be described clearly and completely in conjunction with the drawings in the embodiments of the present disclosure. Based on embodiments of the present disclosure, all other embodiment obtained by those of ordinary skill in the art on the premise of not paying creative labor are in the scope of the protection of the present disclosure.

Figure 2:
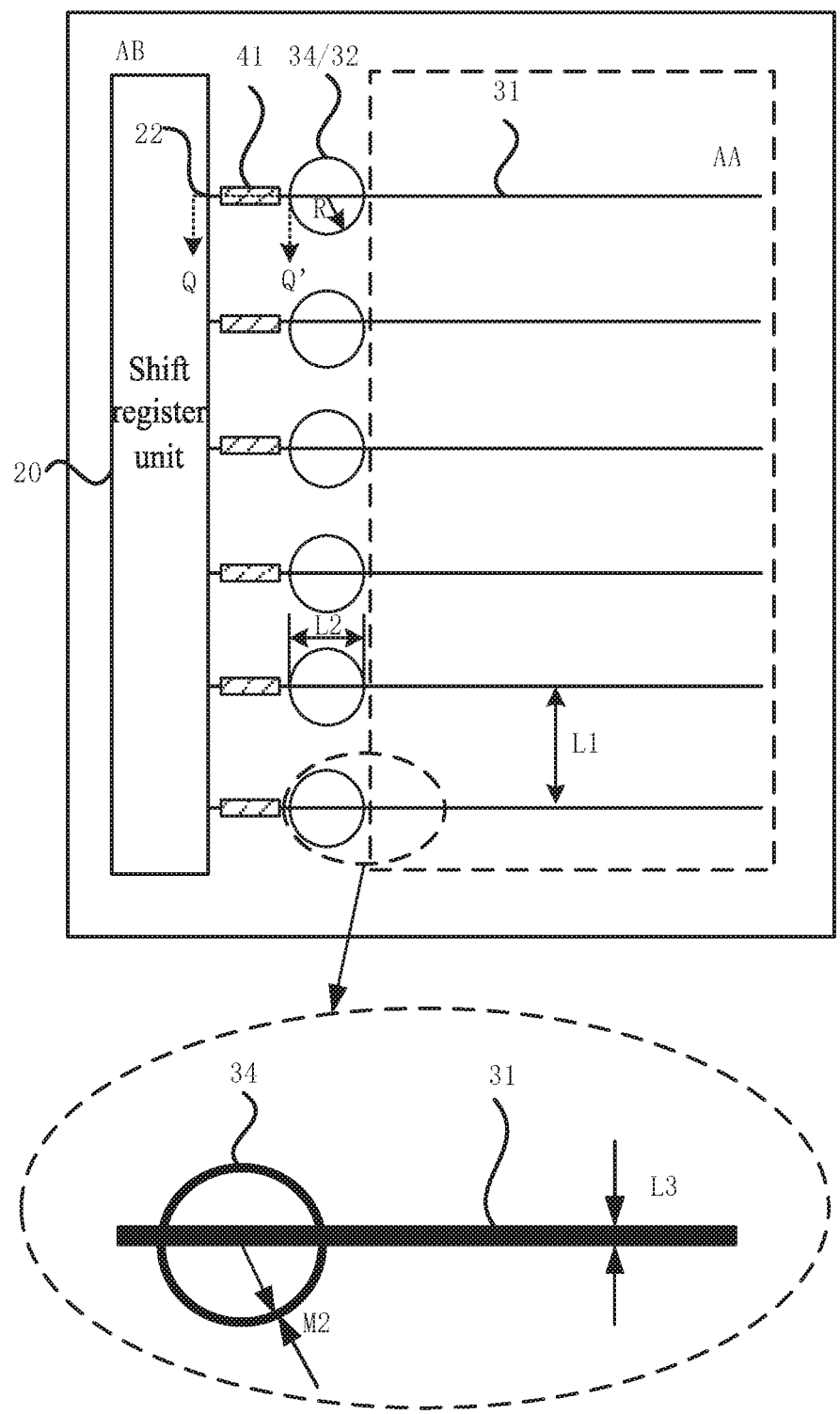
FIG. 2 is a structure diagram illustrating a top view of an array substrate according to an embodiment of the present disclosure.
Figure 3:
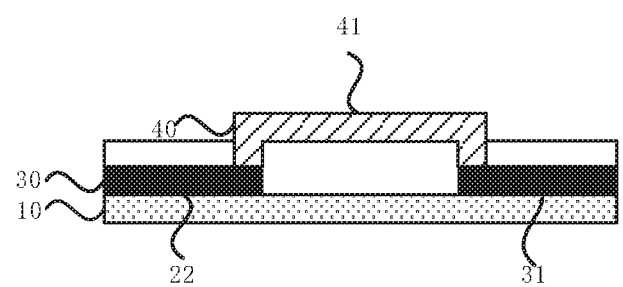
FIG. 3 is a cross-sectional view of FIG. 2 along the Q-Q' direction.

FIG. 2 is a structure diagram illustrating a top view of an array substrate according to an embodiment of the present disclosure, and FIG. 3 is a cross-sectional view of FIG. 2 taken along the Q-Q' direction. As shown in FIGS. 2 and 3, an array substrate provided by an embodiment of the present disclosure includes: a substrate 10 including a display area AA and a peripheral circuit area AB surrounding the display area AA, where the peripheral circuit area AB is provided with a gate drive circuit and the gate drive circuit includes at least one group of cascaded shift registers 20; a first metal layer 30, which is located on a side of the substrate 10; a second metal layer 40, which is located on a side of the first metal layer 30 facing away from the substrate 10; multiple scan lines 31 and multiple connection structures 41 in one-to-one correspondence with the scan lines 31; where the first metal layer 30 includes the multiple scan lines 31; the second metal layer 40 includes the multiple connection structures 41; the shift register 21 includes multiple scan signal output ends 22; the scan signal output ends 22 are electrically connected with the scan lines 31 in a one-to-one correspondence manner through the connection structures 41; at least one end of at least one scan line 31 is provided with an electrostatic dispersion structure 32; and the electrostatic dispersion structure 32 includes at least one first electrostatic dispersion ring 34.

Those skilled in the art may understand that, in order to facilitate the description of the positional relationship between the scan signal output end 22, the scan line 31, and the connection structure 41, FIG. 3 simply shows the positional relationship of the scan signal output end 22, the scan line 31, and the connection structure 41. However, in practice, the array substrate also includes other signal lines and devices, which are not shown here.

Specifically, by providing at least one first electrostatic dispersion ring 34 at at least one end of at least one scan line 31, that is, a place where electrostatic charges are easily gathered, the electrostatic distribution area at the end of the scan line 31 is increased through the first electrostatic dispersion ring 34, the charge density of a charge accumulation area at the end of the scan line 31 is reduced, the risk that an insulating medium at the end of the scan line 31 is broken down is further reduced, and the antistatic damage ability of the display panel in the manufacturing process is improved. In addition, the scan line 31 is electrically connected to the shift register 20 in the gate drive circuit through the connection structure located in the second metal layer 40, that is, the static electricity at the end of the scan line 31 is further discharged through the second metal layer 40. The damage to electronic elements in the shift register 20 due to the fact that electrostatic charges induced on the scan line 31 are transferred to the shift register 20 when the scan line 31 is directly and electrically connected with the shift register 20 is alleviated or avoided, and the anti-electrostatic damage ability of the display panel in the production process is further improved.

It should be noted that the electrostatic dispersion structure 32 may be provided at only one end of the scan line 31, or the electrostatic dispersion structure 32 may be provided at both ends of the scan line 31 respectively; and the electrostatic dispersion structure may be provided at at least one end of one scan line 31, or may also be provided at at least one end of each and every scan line 31, which are not specifically limited in the embodiment, and may be chosen by those skilled in the art according to actual conditions. FIG. 2 is only an exemplary illustration in which the electrostatic dispersion ring 34 is provided at one end of each scan line 31.

Figure 4:
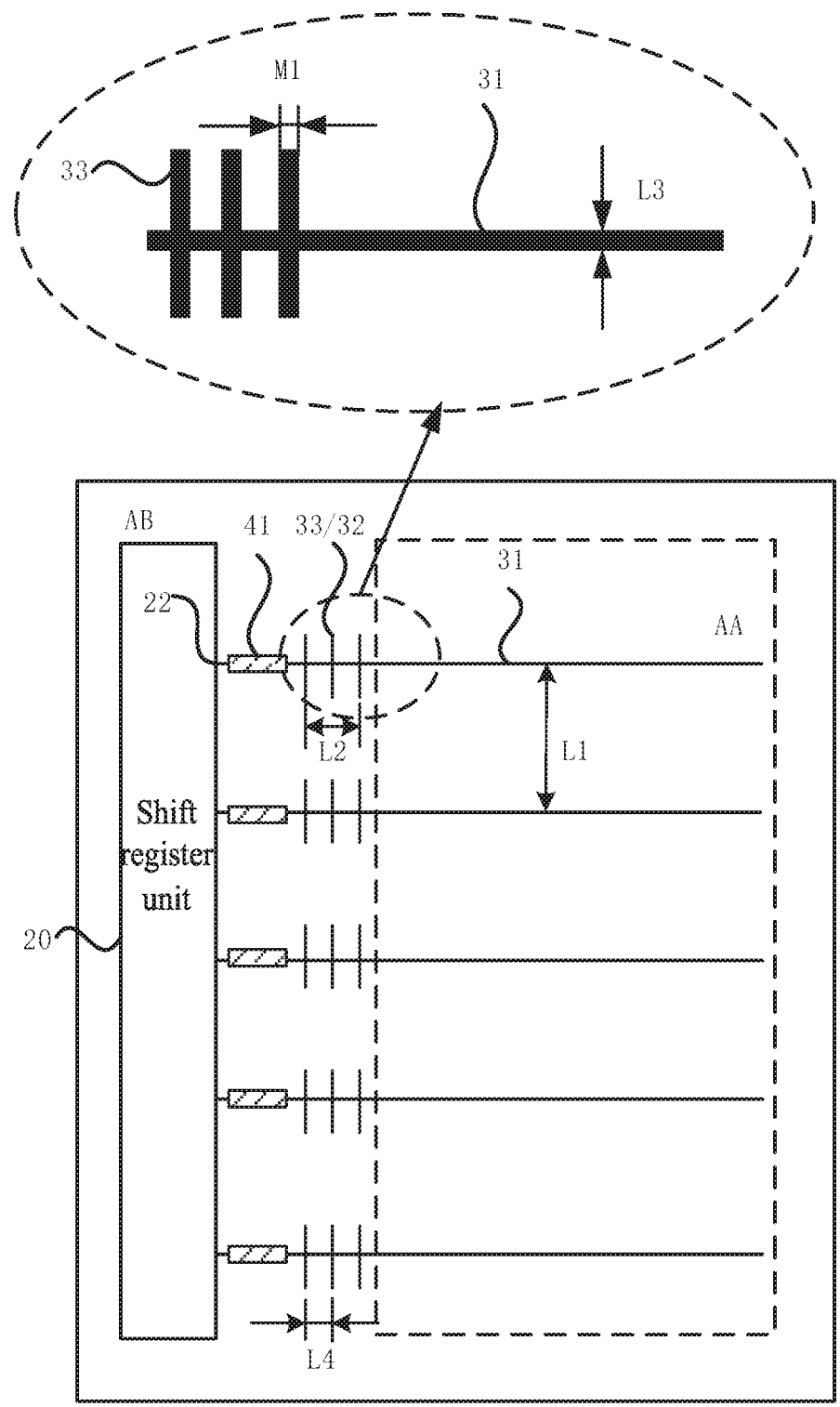
FIG. 4 is a structure diagram illustrating a top view of another array substrate according to an embodiment of the present disclosure.

FIG. 4 is a structure diagram illustrating a top view of another array substrate according to an embodiment of the present disclosure. As shown in FIG. 4, the array substrate provided by the embodiment of the present disclosure includes: a substrate 10 including a display area AA and a peripheral circuit area AB surrounding of the area AA, where the peripheral circuit area AB is provided with a gate drive circuit and the gate drive circuit includes at least one group of cascaded shift registers 20; a first metal layer 30, which is located on a side of the substrate 10; a second metal layers 40, which is located on a side of the first metal layer 30 facing away from the substrate 10; multiple scan lines 31 and multiple connection structures 41 corresponding to the scan lines 31 one-to-one; where the first metal layer 30 includes the multiple scan lines 31; the second metal layer 40 includes the multiple connection structures 41; the shift register 21 includes multiple scan signal output ends 22; the multiple scan signal output ends 22 are electrically connected to the multiple scan lines 31 through the multiple connection structures 41 in one-to-one correspondence; at least one end of at least one scan line 31 is provided with an electrostatic dispersion structure 32; and the electrostatic dispersion structure 32 includes at least one electrostatic dispersion line 33.

Specifically, by providing at least one electrostatic dispersion line 33 at at least one end of at least one scan line 31, that is, a place where electrostatic charges are easily gathered, the electrostatic distribution area at the end of the scan line 31 is increased through the electrostatic dispersion line 33, the charge density of a charge accumulation area at the end of the scan line 31 is reduced, the risk that an insulating medium at the end of the scan line 31 is broken down is further reduced, and the antistatic damage ability of the display panel in the manufacturing process is improved. In addition, the scan line 31 is electrically connected to the shift register 20 in the gate drive circuit through the connection structure located in the second metal layer 40, that is, the static electricity at the end of the scan line 31 is further discharged through the second metal layer 40. The damage to electronic elements in the shift register due to the fact that electrostatic charges induced on the scan line are transferred to the shift register when the scan line 31 is directly and electrically connected with the shift register is alleviated or avoided, and the anti-electrostatic damage ability of the display panel in the production process is further improved.

In one or more embodiments, the substrate 10 has functions of supporting and protecting other film layers in the array substrate, and film layers of the array substrate are formed on the substrate 10. The substrate 10 may be a rigid substrate or a flexible substrate, where a material of the rigid substrate may be glass, a material of the flexible substrate may be polyimide, and a thickness of the substrate 10 may be set according to process requirements and product requirements. In one or more embodiments, the array substrate may include pixel circuits arranged in an array, where pixel circuits in one row are electrically connected to one scan line 31, one pixel circuit includes at least one thin film transistor, and the thin film transistor includes an active layer, a gate electrode, a source electrode and a drain electrode. The array substrate also includes a semiconductor layer on a side of the substrate 10, an insulating layer between the semiconductor layer and the first metal layer, and an insulating layer between the first metal layer and the second metal layer, etc., where the semiconductor layer includes an active layer, the first metal layer includes the scan line and the gate electrode, the second metal layer includes a connection structure, the source electrode and the drain electrode, and the material of the insulating layer may include silicon oxide or silicon nitride, which is not limited by the embodiment of the present disclosure. When the second metal layer includes the connection structure, the source electrode and the drain electrode, the connection structure, the source electrode and the drain electrode are formed of the same material in the same process, that is, the connection structure is formed at the same time with the source electrode and the drain electrode. No additional process is needed, so that the process flow is simplified, and the manufacturing cost of the display panel is reduced.

In one or more embodiments, referring to FIG. 2, the gate drive circuit includes a group of cascaded shift registers 20 located on one side of the display area AA. During a display process, the shift registers 20 output scan signals to the corresponding scan lines 31 through the scan signal output end 22, the cascaded shift registers 20 sequentially output the scan signals to the scan lines 31, the pixel units in the display panel receive the corresponding scan signals line by line and are turned on correspondingly, the signals on the data signal lines are input to the corresponding pixel units, and the display panel achieves a display function.

Figure 5:
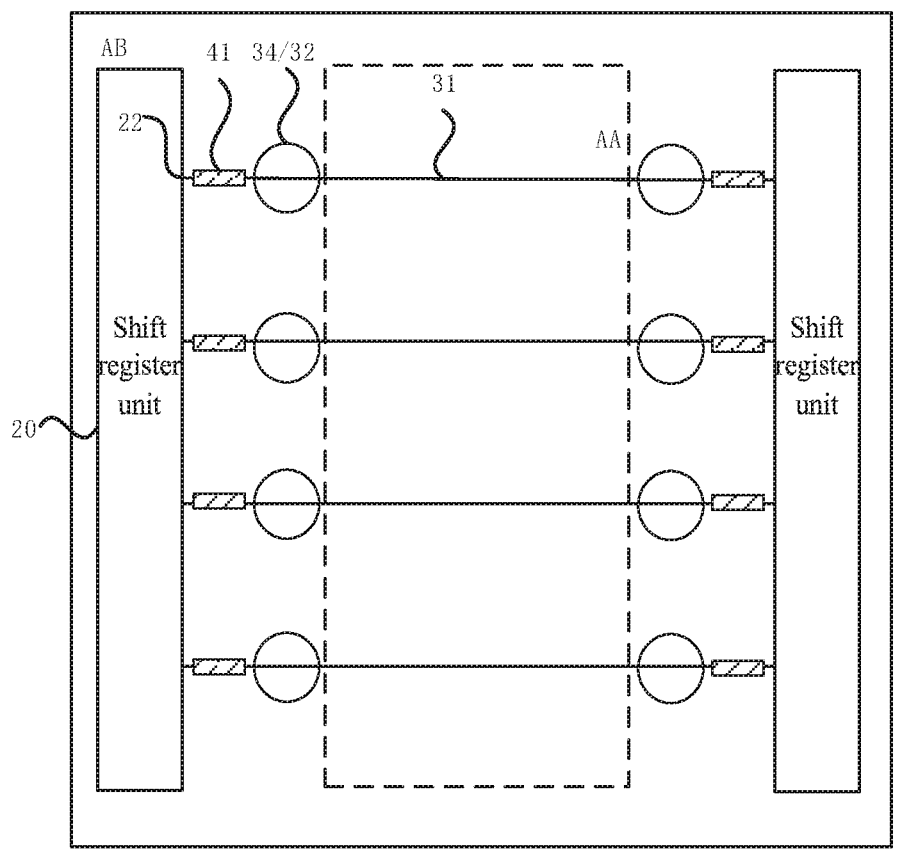
FIG. 5 is a structure diagram illustrating a top view of another array substrate according to an embodiment of the present disclosure.

In one or more embodiments, FIG. 5 is a structure diagram illustrating a top view of another array substrate according to an embodiment of the present disclosure. Referring to FIG. 5, the gate drive circuit includes two groups of cascaded shift registers 20 on opposite sides of the display area AA. When the gate drive circuit includes two groups of cascaded shift registers 20 on opposite sides of the display area AA, during the display process, the shift register units in the two groups of shift registers 20 disposed on different sides are electrically connected through scan lines 31, and the shift register units in the shift registers 20 electrically connected to the same scan line 31 synchronously output scan signals to the scan line 31, so as to avoid the influence of a voltage drop on the scan line 31 on the display effect of the display panel.

It should be noted that the size ratio of the display area AA and the peripheral circuit area AB in the drawings, and the size of structures in the drawings are only illustrative. The size ratio and the size may be set according to actual needs.

In summary, in the array substrate provided by the embodiment of the present disclosure, at least one end of the scan line, that is, a place where electrostatic charges are easily gathered, is provided with an electrostatic dispersion structure, where the electrostatic dispersion structure includes at least one electrostatic dispersion line or at least one first electrostatic dispersion ring. Through the electrostatic dispersion line or the first electrostatic dispersion ring, the electrostatic distribution area at the end of the scan line is increased and the charge density of the electrostatic charges in the accumulation area at the end of the scan line is reduced. Thereby the risk of breakdown of the insulating medium at the end of the scan line is reduced, and the anti-electrostatic damage ability of the display panel in the manufacturing process is improved. In addition, the scan line is electrically connected to the shift register in the gate drive circuit through the connection structure located in the second metal layer, that is, the static electricity at the end of the scan line is further discharged through the second metal layer. The damage to electronic elements in the shift register due to the fact that static charges induced on the scan line are transferred to the shift register when the scan line is directly and electrically connected with the shift register is alleviated or avoided, and the anti-electrostatic damage ability of the display panel in the production process is further improved.

On the basis of the above, in one or more embodiments, with continued reference to FIG. 2, along an extending direction of the scan line 31, an area where the electrostatic dispersion structure 32 is located has a size of L2, where 0<L2≤L1, where L1 is an interval between two adjacent scan lines.

In one or more embodiments, in order to increase an area of the electrostatic distribution, the size L2 of the area where the electrostatic dispersion structure 32 is located may be adjusted freely in an extending direction of the scan line 31, which is not specifically limited in the embodiment. For example, the size of the area where the electrostatic discharge structure 32 is located may be larger than the interval L1 between two adjacent scan lines 31.

In one or more embodiments, the size L2 of the area where the electrostatic discharge structure 32 is located may be smaller than or equal to the interval L1 between two adjacent scan lines 31. Specifically, when the electrostatic dispersion structure 32 is the first electrostatic dispersion ring 34, a width of the first electrostatic dispersion ring 34 should not be too large in a direction perpendicular to the scan line 31 due to the influence of the interval between the adjacent scan lines 31. Therefore, when the electrostatic dispersion structure 32 is the first electrostatic dispersion ring 34, the width of the first electrostatic dispersion ring 34 in the extending direction of the scan line 31 may be the same as the size in a direction perpendicular to the scan line 31, and the size of the area where the first electrostatic dispersion ring 34 is located is at most equal to the interval L1 between two adjacent scan lines 31 in the direction perpendicular to the scan line 31. In the embodiment, along the extending direction of the scan line 31, the size of the area where the first electrostatic dispersion ring 34 is located is L2, and 0<L2≤L1, where L1 is an interval between two adjacent scan lines 31. In this way, the electrostatic distribution area may be increased, and it is also possible to avoid the risk that the width of the electrostatic dispersion ring 32 in the extending direction of the scan line 31 becomes long, in which case the curvature of the electrostatic dispersion ring 32 becomes too large, and electrostatic charges are easily accumulated at corners of the electrostatic dispersion ring 32, causing breakdown of the dielectric at the corners.

Referring to FIG. 4, when the electrostatic dispersion structure 32 is the electrostatic dispersion line 33, because of the repulsive force between the charges of a same polarity, the electrostatic charges are distributed at the ends of the electrostatic dispersion line 33. Therefore, the projection of the area of the electrostatic distribution on the substrate 10 corresponds to the distribution being on the same closed pattern, and the closed pattern may be, for example, a regular pattern or an irregular pattern, and the regular pattern may include, for example, a circular ring or an elliptical ring, that is, a pattern corresponding to the electrostatic dispersion ring. When the electrostatic dispersion structure 32 is the electrostatic dispersion line 33, the width of the electrostatic dispersion line 33 in the extending direction of the scan line 31 should be the same as the size in the direction perpendicular to the scan line 31, while the size of the area where the electrostatic dispersion line 33 is located is at most equal to the interval L1 between two adjacent scan lines 31 in the direction perpendicular to the scan line 31. Therefore in the embodiment, along the extending direction of the scan line 31, the area where the electrostatic dispersion line is located has a size of L2, where 0<L2≤L1, where the interval between two adjacent scan lines 31 is L1. Thus, the area of the electrostatic distribution may be increased, and the electrostatic charges can be prevented from being accumulated and breaking down the dielectric due to the increase in curvature of the area surrounded by the end portion of the electrostatic dispersion line 33.

Figure 6:
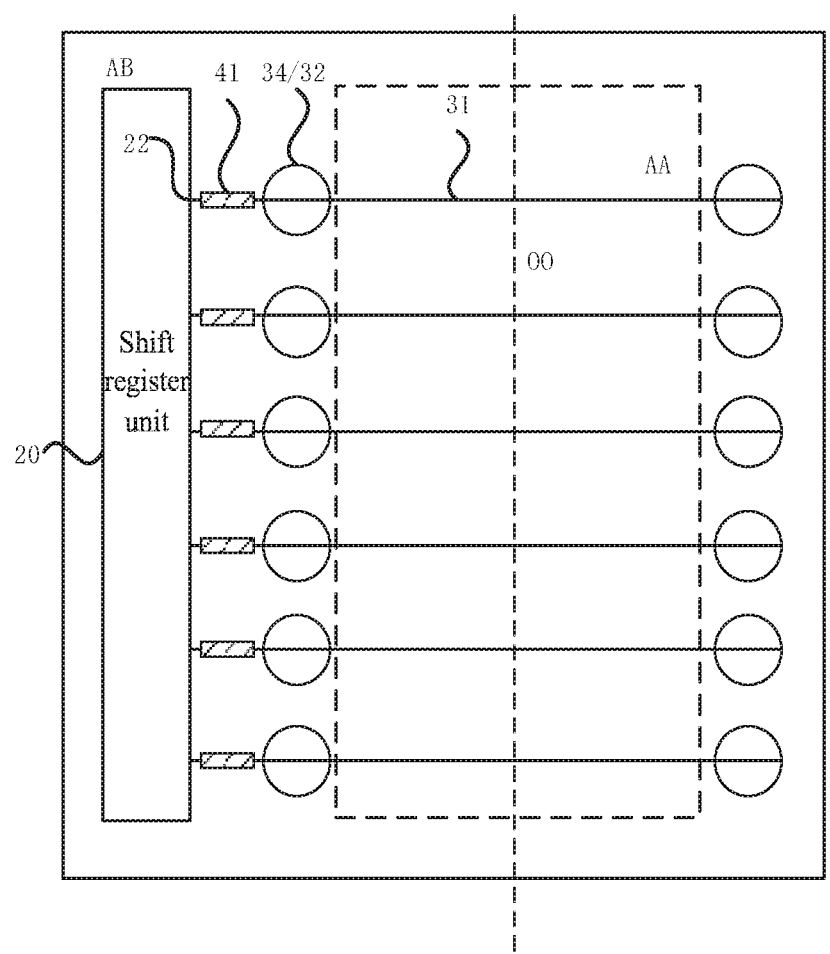
FIG. 6 is a structure diagram illustrating a top view of another array substrate according to an embodiment of the present disclosure.

In one or more embodiments, FIG. 6 is a structure diagram illustrating a top view of another array substrate according to an embodiment of the present disclosure. As shown in FIG. 6, two ends of the scan line 31 are respectively provided with electrostatic dispersion structures 32; in a direction perpendicular to the scan line 31, the electrostatic dispersion structures 32 at both ends of the scan line 31 are symmetrical about the center line OO of the display area AA.

In the embodiment, by disposing electrostatic dispersion structures 32 at two ends of the scan line 31, the electrostatic charges induced on the scan line 31 are dispersed by the electrostatic dispersion structures at the two ends of the scan line 31, thereby the charge density of the charge accumulation area at the ends of the scan line density is reduced.

Further, the electrostatic dispersion structure 32 is symmetrical about the center line OO of the display area AA, so that the induced electrostatic charges are evenly distributed on both ends of the scan line 31 along the extending direction of the scan line 31, and the charge density of the charge accumulation area at the ends of the scan line is further reduced. Thereby the risk of breakdown of the insulating medium at the ends of the scan line is reduced, and the anti-electrostatic damage ability of the display panel during the manufacturing process is improved.

The following is a detailed description of a typical example when the electrostatic dispersion structure includes at least one electrostatic dispersion line. It should be understood that none of the following contents is intended to limit the present disclosure.

Figure 7:
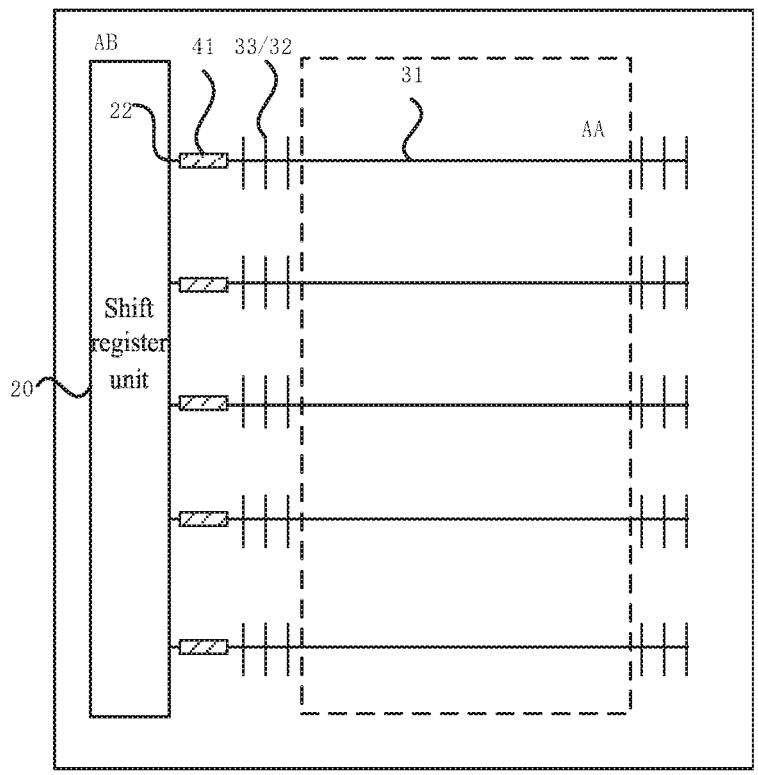
FIG. 7 is a structure diagram illustrating a top view of another array substrate according to an embodiment of the present disclosure.
Figure 8:
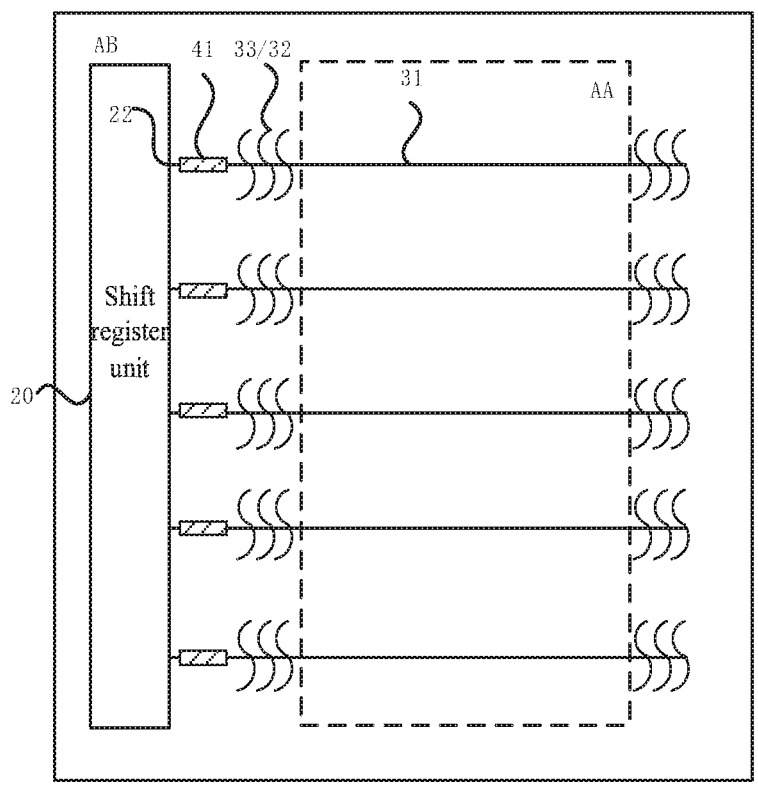
FIG. 8 is a structure diagram illustrating a top view of another array substrate according to an embodiment of the present disclosure.
Figure 9:
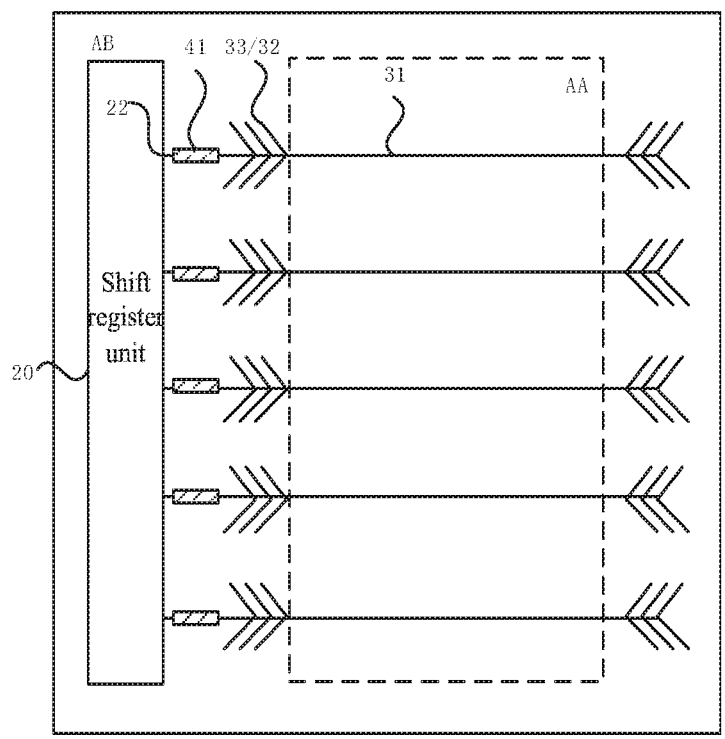
FIG. 9 is a structure diagram illustrating a top view of another array substrate according to an embodiment of the present disclosure.

In one or more embodiments, FIG. 7 is a structure diagram illustrating a top view of another array substrate according to an embodiment of the present disclosure. As shown in FIG. 7, the electrostatic dispersion structure 32 includes at least one electrostatic dispersion line 33, and the shape of the vertical projection of the electrostatic dispersion line 33 on the plane where the substrate 10 is located includes a line shape. FIG. 8 is a structure diagram of another array substrate according to an embodiment of the present disclosure. As shown in FIG. 8, the electrostatic dispersion structure 32 includes at least one electrostatic dispersion line 33, and the shape of the vertical projection of the electrostatic dispersion line 33 on the plane where the substrate 10 is located includes a wavy shape. FIG. 9 is a structure diagram of another array substrate according to an embodiment of the present disclosure. As shown in FIG. 9, the electrostatic dispersion structure 32 includes at least one electrostatic dispersion line 33, and the shape of the vertical projection of the electrostatic dispersion line 33 on the plane where the substrate 10 is located includes a zigzag shape.

In the embodiment, when the shape of the vertical projection of the electrostatic dispersion line 33 on the plane where the substrate 10 is located includes a line shape, a wavy shape or a zigzag shape, the electrostatic dispersion structure 33 of the line shape, the wavy shape or zigzag shape disperses the electrostatic charge induced on the scan line 31, and the charge density of the charge accumulation area at the ends of the scan line 31 is reduced. Thereby the risk of breakdown of the insulating medium at the ends of the scan line 31 is reduced, and the anti-electrostatic damage ability of the display panel during the manufacturing process is improved.

Those skilled in the art may understand that the shape of the vertical projection of the electrostatic dispersion line 33 on the plane of the substrate 10 includes, but is not limited to, the above examples. Those skilled in the art may set the shape of the electrostatic dispersion line 33 according to the product requirements. There is no specific limitation in the disclosure.

It should be noted that FIGS. 7, 8, and 9 exemplify that the electrostatic dispersion lines 33 are disposed at two ends of the scan lines 31, and the electrostatic dispersion lines 33 are disposed at the ends of each scan line 31. The specific arrangements shown is not intended to limit the present application.

In one or more embodiments, with continued reference to FIG. 4, the electrostatic dispersion structure 32 includes at least one electrostatic dispersion line 33. The line width of the electrostatic dispersion line 33 is M1, where $0<M1\leq 2\times L3$, where the line width of the scan line 31 is L3.

In the embodiment, the line width of the electrostatic dispersion line 33 is set to be less than or equal to twice the line width L3 of the scan line 31, so that the load of the electrostatic dispersion line 33 will not increase because the width of the electrostatic dispersion line 33 is too large, that is, the electrostatic charges at the end of the scan line 31 can be dispersed without adding additional load.

In one or more embodiments, with continued reference to FIG. 4, the electrostatic dispersion structure 32 includes multiple electrostatic dispersion lines 33. An interval between adjacent electrostatic dispersion lines is L4, where $L2/10<L4\leq L2$, where L2 is a size of an area where the electrostatic dispersion structure is located.

In the embodiment, the interval between adjacent electrostatic dispersion lines 33 is L4, and $L2/10<L4\leq L2$. In this way, the number of electrostatic dispersion lines 33 is not reduced since the interval between adjacent electrostatic dispersion lines 33 is too large. On one hand, if the number of electrostatic dispersion lines 33 is reduced, the electrostatic charges divided to each electrostatic dispersion line 33 will increase under the same total amount of electrostatic charge, the electric field intensity at the end of the electrostatic dispersion line 33 will become larger, and the risk of breakdown of the medium is increased. At the same time, the number of electrostatic dispersion lines 33 is not increased since the interval between adjacent electrostatic dispersion lines 33 is too small, since if the number of electrostatic dispersion lines 33 becomes larger, the load will also become larger. Therefore, based on this, through theoretical calculation (Huygens principle), when the interval between adjacent electrostatic dispersion lines 33 is less than 11% of one half of the size of the area where the electrostatic dispersion structure 32 is located, the electrostatic dispersion effect is 95%, and the load will not be increased. Therefore, in the embodiment, the interval between adjacent electrostatic dispersion lines 33 may be L4, where $L2/10<L4\leq L2$, where the area where the electrostatic dispersion structure 32 is located has a size of L2, so that the electrostatic dispersion effect is ensured and the load of the electrostatic dispersion structure 32 is not increased.

It should be noted that FIG. 4 only exemplarily shows that the electrostatic dispersion structure 32 includes three electrostatic dispersion lines 33, and is not intended to limit the application. Those skilled in the art may set the number of electrostatic dispersion lines according to the product requirements, for example, by setting the number of the electrostatic dispersion lines 33 to 10. Hereinafter, also for explaining the positional relationship of the electrostatic dispersion lines 33, the number of the electrostatic dispersion lines 33 is exemplarily shown, and those skilled in the art may actually set the number of the electrostatic dispersion lines 33 according to the product requirements, which is not shown here.

Figure 10:
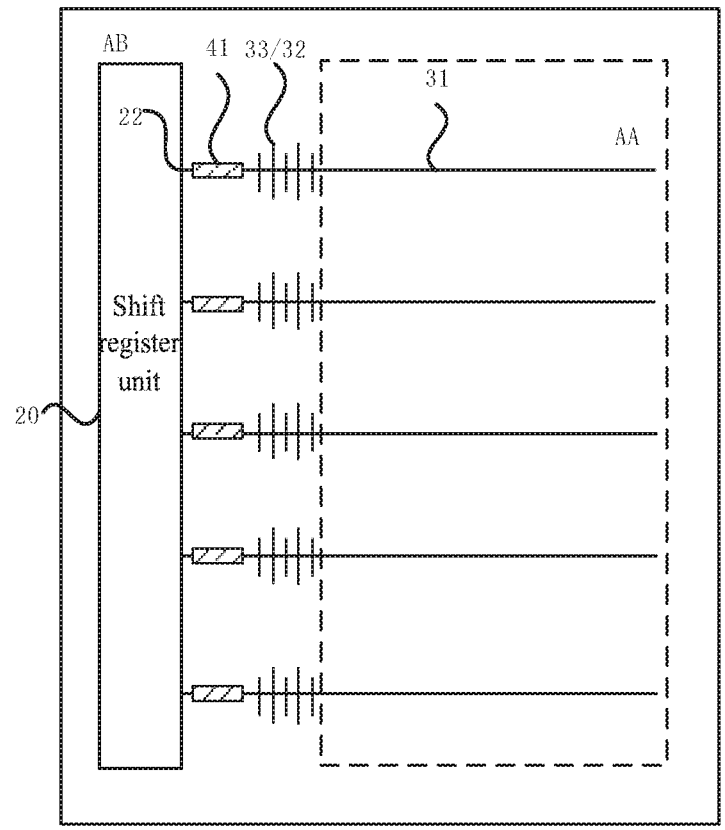
FIG. 10 is a structure diagram illustrating a top view of another array substrate according to an embodiment of the present disclosure.

In one or more embodiments, FIG. 10 is a structure diagram illustrating a top view of another array substrate according to an embodiment of the present disclosure. As shown in FIG. 10, the electrostatic dispersion structure 32 includes multiple electrostatic dispersion lines 33, and the vertical distances from the ends of the multiple electrostatic dispersion lines 33 to the scan line 31 are different in the direction perpendicular to the scan lines 31.

In the embodiment, the vertical distances from the ends of the multiple electrostatic dispersion lines 33 to the scan lines 31 are different along the direction perpendicular to the scan lines 31, so that the distance between the static electricity charges at the ends of the adjacent electrostatic dispersion lines 31 is reduced, the repulsive force between the static electricity charges at the ends of the adjacent electrostatic dispersion lines 31 is further reduced, and the risk that the static electricity charges distributed on the electrostatic dispersion lines 31 move to the scan lines 31 under the repulsive force and break down the medium is avoided.

In one or more embodiments, with continued reference to FIG. 7, the electrostatic dispersion structure 32 includes multiple electrostatic dispersion lines 33, and the vertical distances from the ends of the multiple electrostatic dispersion lines 33 to the scan line 31 are different in the direction perpendicular to the scan lines 31.

In the embodiment, when the vertical distances from the ends of the multiple electrostatic dispersion lines 33 to the scan line 31 are the same, the same process may be adopted when forming the multiple electrostatic dispersion lines 33, the process steps are simplified, and the production efficiency is improved.

Figure 11:
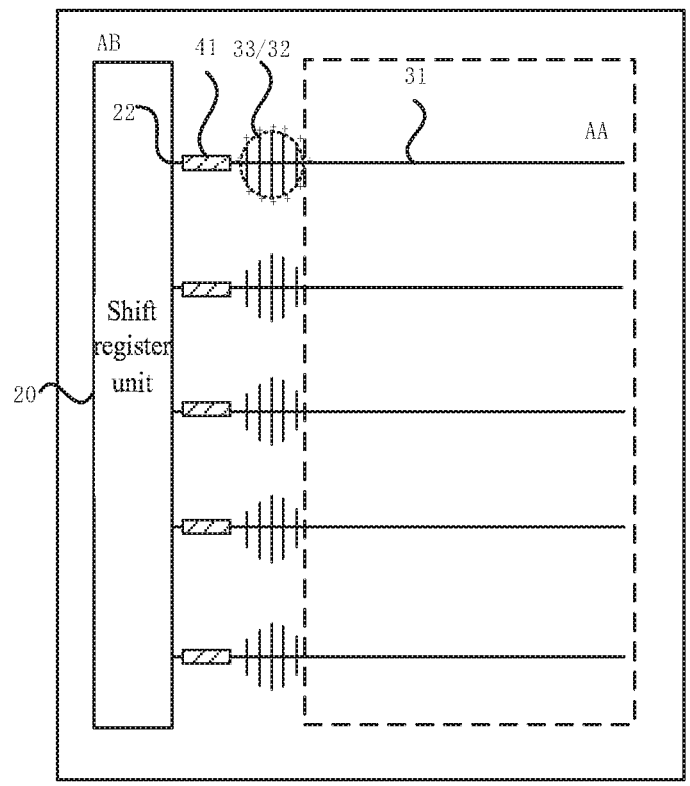
FIG. 11 is a structure diagram illustrating a top view of another array substrate according to an embodiment of the present disclosure.

In one or more embodiments, FIG. 11 is a structure diagram illustrating a top view of another array substrate according to an embodiment of the present disclosure. As shown in FIG. 11, the extending direction of the multiple electrostatic dispersion lines 31 are perpendicular to the scan line 31, and the vertical projections of the ends of the multiple electrostatic dispersion lines 31 on the substrate 10 are distributed on a same circle.

Since a repulsive force exists between electrostatic charges of the same polarity and the magnitude of the repulsive force is inversely proportional to the distance between the electrostatic charges, the electrostatic charge density at each point on an irregular conductor is proportional to the curvature at that point. When the vertical projections of the ends of the multiple electrostatic dispersion lines 33 on the substrate 10 are distributed on the same circle, the dispersion effect of the electrostatic charge is uniform, and the risk of breakdown of the medium due to the accumulation of electrostatic charges on the scan line 31 is avoided.

In one or more embodiments, with continued reference to FIG. 11, the intervals between adjacent electrostatic dispersion lines 33 are equal.

In the embodiment, when the intervals between adjacent electrostatic dispersion lines 33 are equal, the electrostatic charges are further uniformly distributed on the electrostatic dispersion lines 33. In this way, the risk of breakdown of the medium due to the accumulation of electrostatic charges on the scan line 31 is further avoided.

Figure 12:
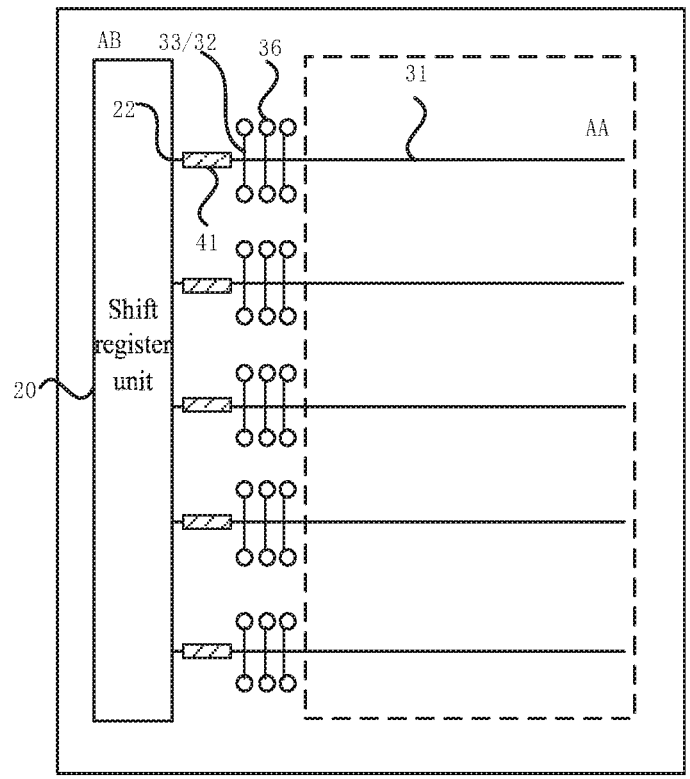
FIG. 12 is a structure diagram illustrating a top view of another array substrate according to an embodiment of the present disclosure.

In one or more embodiments, FIG. 12 is a structure diagram illustrating a top view of another array substrate according to an embodiment of the present disclosure. As shown in FIG. 12, the electrostatic dispersion structure 32 includes at least one electrostatic dispersion line 33, and the electrostatic dispersion structure 32 further includes a second electrostatic dispersion ring 36 disposed at an end of the electrostatic dispersion line 33.

When the electrostatic dispersion line 33 is provided at an end of the scan line 31, the static electricity induced on the scan line 31 will be dispersed at the end of the electrostatic dispersion line 33. Therefore, if the amount of charge of the induced static electricity is too large, there is still a risk of breakdown of the insulating medium at the end. Therefore, in the embodiment, by providing the second electrostatic dispersion ring 36 at the end of the electrostatic dispersion line 33, that is, the area where static charges accumulate, the electrostatic distribution area of the end of the electrostatic dispersion line 33 is further expanded and the charge density of the charge accumulation area at the end of the electrostatic dispersion line 33 is reduced. Thereby the risk of breakdown of the insulating medium at the end of the electrostatic dispersion line 33 is reduced, and the anti-electrostatic damage ability of the display panel during the manufacturing process is further improved.

In one or more embodiments, with continued reference to FIG. 12, a corner of the second electrostatic dispersion ring 36 is arc-shaped.

Since the charge density is proportional to the curvature, if the curvature at the corner of the second electrostatic dispersion ring 36 is large, the electrostatic charge may accumulate at the corner, resulting in the risk of breakdown of the medium at the corner. Therefore, in the embodiment, by setting the corner of the second electrostatic dispersion ring 36 to be arc-shaped, the risk of breakdown of the medium at the corner due to electrostatic charge accumulating at a sharp corner in a case of the sharp corner of the second electrostatic dispersion ring 36 is avoided.

The above is a detailed description of a typical example when the electrostatic dispersion structure includes at least one electrostatic dispersion line.

The following is a detailed description with a typical example when the electrostatic dispersion structure includes at least one electrostatic dispersion ring. None of the following contents is intended to limit the present disclosure.

In one or more embodiments, with continued reference to FIG. 2, the electrostatic dispersion structure 32 further includes at least one first electrostatic dispersion ring 34, and a corner of the first electrostatic dispersion ring 34 is arc-shaped.

If the curvature at the corner of the first electrostatic dispersion ring 34 is large, electrostatic charges may accumulate at the corner, resulting in the risk of breakdown of the medium at the corner. Therefore, in the embodiment, by setting the corner of the first electrostatic dispersion ring 34 to be arc-shaped, the risk of breakdown of the medium at the corner due to electrostatic charge accumulating at the sharp corner in a case of the sharp corner of the first electrostatic dispersion ring 34 is avoided.

In one or more embodiments, with continued reference to FIG. 2, the vertical projection of the first electrostatic dispersion ring 34 on the substrate 10 has a shape of a circular ring; and the radius of the circular ring is R, where $0<R<(\frac{1}{2})\times L1$, where the interval between two adjacent scan lines 31 is L1.

Figure 13:
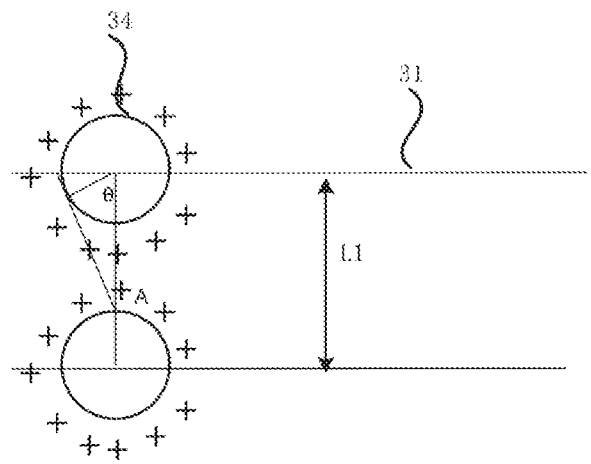
FIG. 13 is a schematic diagram illustrating a positional relationship between two adjacent scan lines and a first electrostatic dispersion ring according to an embodiment of the present disclosure.
Figure 14:
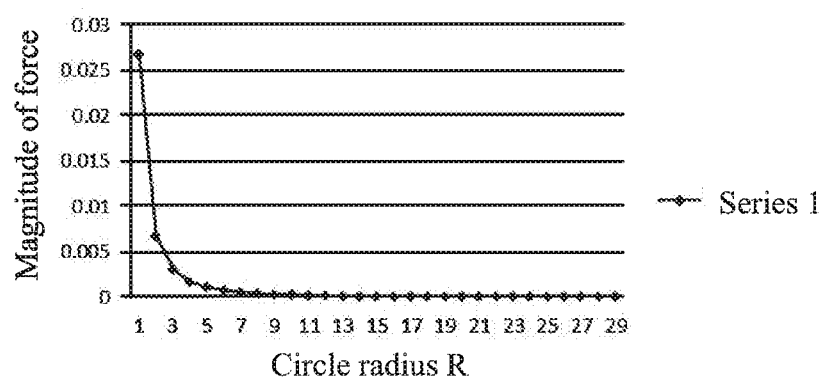
FIG. 14 is a diagram illustrating a relationship between a force on a charge at point A on a first electrostatic dispersion ring and a radius of the first electrostatic dispersion ring according to an embodiment of the present disclosure.

FIG. 13 is a schematic diagram illustrating a position relationship between two adjacent scan lines and a first electrostatic dispersion ring according to an embodiment of the present disclosure, and FIG. 14 is a diagram illustrating a relationship between force on a charge at point A on a first electrostatic dispersion ring and a radius of the first electrostatic dispersion ring according to an embodiment of the present disclosure. The abscissa represents the radius R of the first electrostatic dispersion ring, and the ordinate represents the repulsive force of the electric charge on point A and the electric charges on a portion, which is close to the point A and has a radian of 2θ, of a first electrostatic dispersion ring provided at the end of the adjacent scan line. Specifically, the radius of the circular ring is R, the interval between two adjacent scan lines 31 is L1, and the electric force applied by the adjacent first electrostatic dispersion ring on the electric charge at point A is generated by the electric charges on a portion having a radian of 2θ of the first electrostatic dispersion ring. Since the force between point charges is $F=k\times(q1\times q2)/(r^2)$, when the distance of the first electrostatic dispersion rings 34 at the ends of the adjacent scan lines 31 is large enough, the charge density on each first electrostatic dispersion ring is $Q/(2\pi R)$, and $\cos(\theta)=R/(L1-R)$. The point A and an area around the point A, for example the length of this area being L, will be subject to the repulsive force of the electric charges on the portion close to the point A and having a radian of 2θ of the first electrostatic dispersion ring provided at the end of the adjacent scan line, and the force applied on the charges at the point A and the area around the point A is F, where $F \approx k \times ((Q/2\pi R) \times L) \times (Q/2\pi R) \times 2\theta/(L1-2R)^2$. Based on this, the applicant measured the relationship between the charge force at the point A and the area around point A and the radius of the semi-circle. Referring to FIG. 14, as the radius R of the circular ring increases, the force applied on the charge at the point A decreases. Thus, it is concluded that when the radius of the circular ring is at the maximum, that is, half of the interval between the two adjacent scan lines, the force at the point A is at the minimum. Therefore, in the embodiment, by setting the radius of the circular ring to be greater than zero and less than half of the interval L1 between two adjacent scan lines 31, the electrostatic charge may be dispersed, the repulsive force of the electrostatic charges on adjacent first electrostatic dispersion rings is at the minimum, the electrostatic charge can be evenly and stably distributed on the first electrostatic dispersion ring 34, and the risk that the electrostatic charges distributed on the first electrostatic dispersion ring 34 may move to the scan line 31 under the repulsive force and cause breakdown of the medium is avoided.

In one or more embodiments, with continued reference to FIG. 2, the line width of the first electrostatic dispersion ring 34 is M2, where 0<M2≤2×L3, where L3 is the line width of the scan line 31.

In the embodiment, the line width of the first electrostatic dispersion ring 34 is set to be greater than 0 and less than or equal to twice the line width L3 of the scan line 31, so that the load of the electrostatic dispersion ring 34 will not increase because the width of the electrostatic dispersion ring 34 is too large, that is, in the embodiment, the line width of the first electrostatic dispersion ring 34 is M2, where 0<M2≤2×L3, where the line width of the scan line 31 is L3, and the electrostatic charges at the end of the scan line 31 can be dispersed without adding additional load.

In one or more embodiments, with continued reference to FIG. 2, the electrostatic dispersion structure 32 includes one first electrostatic dispersion ring 34, and the first electrostatic dispersion ring 34 is axially symmetrical about the scan line 31.

In the embodiment, the first electrostatic dispersion ring 34 is axially symmetrical about the scan line 31, so that the induced electrostatic charges are evenly distributed on both sides of the scan line 31 in a direction perpendicular to the scan line 31, and the risk of breakdown of the medium due to a large local electric field at the end of the scan line 31 is avoided.

Figure 15:
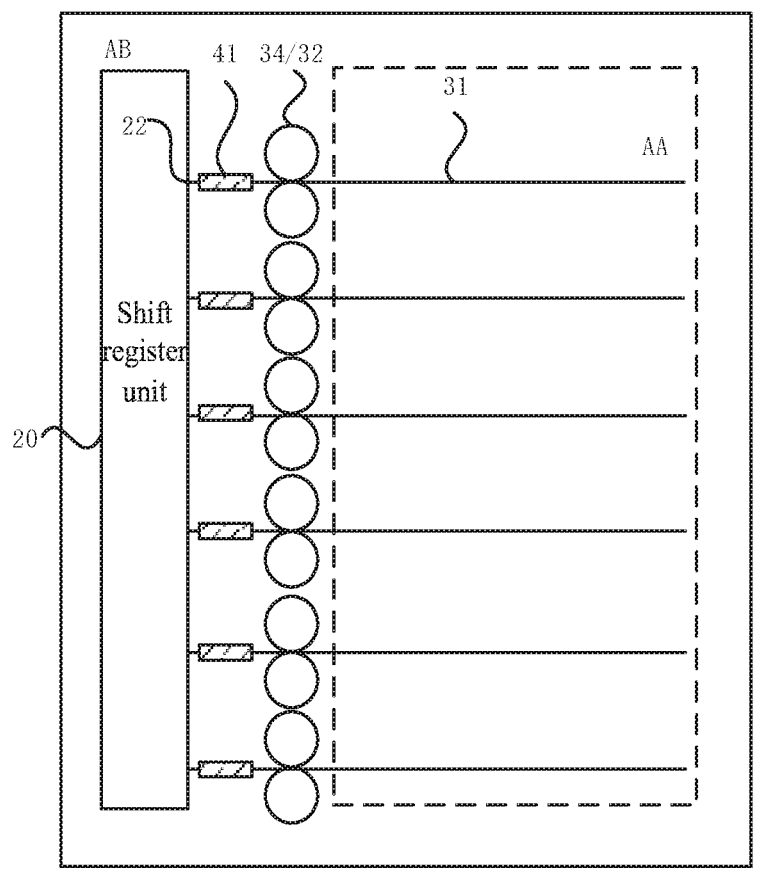
FIG. 15 is a structure diagram illustrating a top view of another array substrate according to an embodiment of the present disclosure.

In one or more embodiments, FIG. 15 is a structure diagram illustrating a top view of another array substrate according to an embodiment of the present disclosure. As shown in FIG. 10, the electrostatic dispersion structure 32 includes two first electrostatic dispersion rings 34, and the two first electrostatic dispersion rings 34 are axially symmetrical about the scan line 31.

When the electrostatic dispersion structure 32 includes the two first electrostatic dispersion rings 34, while not increasing the load, the area of electrostatic charge dispersion is increased, and the charge density of the charge accumulation area at the end of the scan line is reduced. Thereby the risk of breakdown of the insulating medium at the end of the scan line is reduced, and the anti-electrostatic damage ability of the display panel in the manufacturing process is improved. Further, the two first electrostatic dispersion rings 34 are axially symmetrical about the scan line 31, so that the electrostatic charge at the end of the scan line is evenly distributed on both sides of the scan line to avoid the risk of breakdown of the medium due to the large local electric field when the electrostatic charge is accumulated on one side.

It should be noted that FIG. 15 only exemplarily shows that the electrostatic dispersion structure 32 includes two first electrostatic dispersion rings 34, and the two first electrostatic dispersion rings 34 are axially symmetrical about the scan line 31. This example is not intended to limit the application. Those skilled in the art may set the number of electrostatic dispersion lines according to the product requirements, for example, the electrostatic dispersion structure 32 including four first electrostatic dispersion rings 34 and the four first electrostatic dispersion rings 34 being axially symmetrical about the scan line 31; or the electrostatic dispersion structure 32 including six first electrostatic dispersion rings 34 and the six first electrostatic dispersion rings 34 being axially symmetrical about the scan line 31.

Based on the same inventive concept, an embodiment of the present disclosure also provides a display panel, including the array substrate of any embodiment of the present disclosure. Since the display panel provided by the embodiment of the present disclosure includes any one of the array substrates provided by the above embodiments, the display panel has the same or corresponding technical effects as the array substrate provided by the above embodiments.

In one or more embodiments, the display panel provided by the embodiment of the present disclosure may be an organic light-emitting diode display panel or a liquid crystal display panel.

Figure 16:
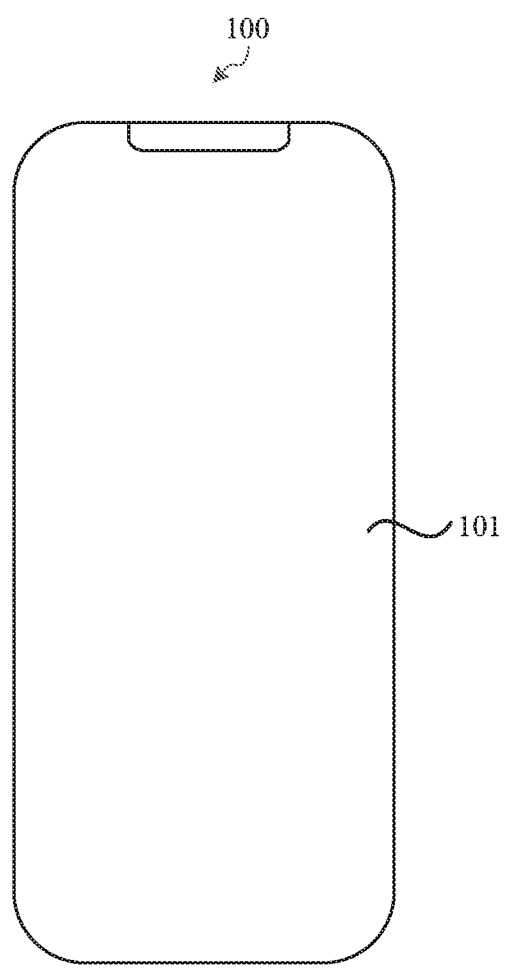
FIG. 16 is a structure diagram of a display device according to an embodiment of the present disclosure.

Based on the same inventive concept, an embodiment of the present disclosure also provides a display device, including the array substrate of any embodiment of the present disclosure. Specifically, FIG. 16 is a structure diagram of a display device provided by an embodiment of the present disclosure. As shown in FIG. 16, the display device 100 includes the display panel 101 provided by the above embodiment. Exemplarily, the display device 100 may be an electronic device such as a mobile phone, a computer, a smart wearable device (for example, a smart watch), or a vehicle-mounted display device, which is not limited in the present disclosure.

What is claimed is:

1. An array substrate, comprising:
   a substrate, wherein the substrate comprises a display area and a peripheral circuit area surrounding the display area; the peripheral circuit area is provided with a gate drive circuit; and the gate drive circuit comprises at least one group of shift registers connected in cascade;
   a first metal layer, which is located on a side of the substrate;
   a second metal layer, which is located on a side of the first metal layer facing away from the substrate; and
   a plurality of scan lines and a plurality of connection structures corresponding to the plurality of scan lines one-to-one;
   wherein the first metal layer comprises the plurality of scan lines; the second metal layer comprises the plurality of connection structures;
   the shift registers comprise a plurality of scan signal output ends; the plurality of scan signal output ends are electrically connected to the plurality of scan lines one-to-one through the plurality of connection structures;
   at least one end of at least one scan line of the plurality of scan lines is provided with an electrostatic dispersion structure; and the electrostatic dispersion structure comprises one of: at least one electrostatic dispersion line, or at least one first electrostatic dispersion ring.

2. The array substrate of claim 1, wherein along an extending direction of the at least one scan line, an area where the electrostatic dispersion structure is located has a size of L2, wherein 0<L2≤L1, wherein L1 is an interval between each two adjacent scan lines of the plurality of scan lines.

3. The array substrate of claim 2, wherein the electrostatic dispersion structure comprises a plurality of electrostatic dispersion lines; an interval between each adjacent electrostatic dispersion lines of the plurality of electrostatic dispersion lines is L4, and L2/10<L4≤L2, wherein L2 is a size of an area where the electrostatic dispersion structure is located.

4. The array substrate of claim 1, wherein the at least one scan line is provided with electrostatic dispersion structures at both ends of the at least one scan line; and
the electrostatic dispersion structures at both ends of at least one scan line are symmetrical about a center line of the display area; and the center line is parallel to a direction perpendicular to the at least one scan line.

5. The array substrate of claim 1, wherein the electrostatic dispersion structure comprises at least one electrostatic dispersion line; and a vertical projection of the electrostatic dispersion line on a plane where the substrate is located has one of a line shape, a wavy shape or a zigzag shape.

6. The array substrate of claim 1, wherein the electrostatic dispersion structure comprises at least one electrostatic dispersion line; the electrostatic dispersion line has a line width of M1, wherein 0<M1≤2×L3, wherein L3 is a line width of each of the plurality of scan lines.

7. The array substrate of claim 1, wherein the electrostatic dispersion structure comprises a plurality of electrostatic dispersion lines; in a direction perpendicular to the scan line, vertical distances from ends of the plurality of electrostatic dispersion lines to the at least one scan line are different.

8. The array substrate of claim 7, wherein the extending direction of the plurality of electrostatic dispersion lines is perpendicular to the at least one scan line, and vertical projections of the ends of the plurality of electrostatic dispersion lines on the substrate are arranged on a same circle.

9. The array substrate of claim 8, wherein each adjacent electrostatic dispersion line of the plurality of electrostatic dispersion lines has an equal interval.

10. The array substrate of claim 1, wherein the electrostatic dispersion structure comprises at least one electrostatic dispersion line; and the electrostatic dispersion structure further comprises a second electrostatic dispersion ring disposed at an end of the electrostatic dispersion line.

11. The array substrate of claim 10, wherein a corner of the second electrostatic dispersion ring is arc-shaped.

12. The array substrate of claim 1, wherein the electrostatic dispersion structure comprises at least one first electrostatic dispersion ring; and a corner of the first electrostatic dispersion ring is arc-shaped.

13. The array substrate of claim 12, wherein a vertical projection of the first electrostatic dispersion ring on the substrate has a shape of a circular ring; and
the circular ring has a radius of R, wherein 0<R<(½)×L1, wherein L1 is an interval between each two adjacent scan lines of the plurality of scan lines.

14. The array substrate of claim 12, wherein the first electrostatic dispersion ring has a line width of M2, wherein 0<M2≤2×L3, wherein L3 is a line width of each of the plurality of scan lines.

15. The array substrate of claim 12, wherein the electrostatic dispersion structure comprises one first electrostatic dispersion ring; and the first electrostatic dispersion ring is axially symmetrical about the at least one scan line.

16. The array substrate of claim 1, wherein the electrostatic dispersion structure comprises two first electrostatic dispersion rings; and the two first electrostatic dispersion rings are disposed axially symmetrically about the at least one scan line.

17. A display panel, comprising an array substrate,
wherein the array substrate comprises:
a substrate, wherein the substrate comprises a display area and a peripheral circuit area surrounding the display area; the peripheral circuit area is provided with a gate drive circuit; and the gate drive circuit comprises at least one group of shift registers connected in cascade;
a first metal layer, which is located on a side of the substrate;
a second metal layer, which is located on a side of the first metal layer facing away from the substrate; and
a plurality of scan lines and a plurality of connection structures corresponding to the plurality of scan lines one-to-one;
wherein the first metal layer comprises the plurality of scan lines; the second metal layer comprises the plurality of connection structures;
the shift registers comprise a plurality of scan signal output ends; the plurality of scan signal output ends are electrically connected to the plurality of scan lines one-to-one through the plurality of connection structures;
at least one end of at least one scan line of the plurality of scan lines is provided with an electrostatic dispersion structure; and
the electrostatic dispersion structure comprises one of: at least one electrostatic dispersion line, or at least one first electrostatic dispersion ring.

18. A display device, comprising a display panel,
wherein the display panel comprises an array substrate, and the array substrate comprises:
a substrate, wherein the substrate comprises a display area and a peripheral circuit area surrounding the display area; the peripheral circuit area is provided with a gate drive circuit; and the gate drive circuit comprises at least one group of shift registers connected in cascade;
a first metal layer, which is located on a side of the substrate;
a second metal layer, which is located on a side of the first metal layer facing away from the substrate; and
a plurality of scan lines and a plurality of connection structures corresponding to the plurality of scan lines one-to-one;
wherein the first metal layer comprises the plurality of scan lines; the second metal layer comprises the plurality of connection structures;
the shift registers comprise a plurality of scan signal output ends; the plurality of scan signal output ends are electrically connected to the plurality of scan lines one-to-one through the plurality of connection structures;

at least one end of at least one scan line of the plurality of scan lines is provided with an electrostatic dispersion structure; and the electrostatic dispersion structure comprises one of: at least one electrostatic dispersion line, or at least one first electrostatic dispersion ring.

* * * * *